United States Patent [19]
McGehee

[11] Patent Number: 4,852,016
[45] Date of Patent: Jul. 25, 1989

[54] MOAT ROUTER FOR INTEGRATED CIRCUITS

[75] Inventor: Richard K. McGehee, Renton, Wash.

[73] Assignee: Seattle Silicon Corporation, Bellevue, Wash.

[21] Appl. No.: 67,327

[22] Filed: Jun. 26, 1987

[51] Int. Cl.⁴ .............................................. G06F 15/60
[52] U.S. Cl. .................................. 364/491; 364/490; 364/489; 364/488
[58] Field of Search ................ 364/488, 489, 490, 491

[56] References Cited

U.S. PATENT DOCUMENTS 4,613,940  9/1986  Shenton et al. ..................... 364/490
4,615,011  9/1986  Linsker .............................. 364/491

OTHER PUBLICATIONS

"An Over-Cell Gate Array Channel Router", H. E. Krohn, IEEE 20th Design Automation Conference, 1983, pp. 665-670.

"A New Two-Dimensional Routing Algorithm", Chi-Ping-Hsu, IEEE 19th Design Automation Conference, 1982, pp. 46-50.

"A New Routing Region Definition and Ordering Scheme Using L-Shaped Channels", Dai et al., IEEE Proceeding of ISCA 1985, pp. 29-30.

"A Routing Program Applicable to Various Chip Structure of Gate Arrays", Terai et al., Ronbunshi, vol. 25, No. 3, May 1984, pp. 357-364.

Primary Examiner—Gary Chin
Assistant Examiner—V. N. Trans
Attorney, Agent, or Firm—Seed and Berry

[57] ABSTRACT

A method of specification of the routing of signal and planar power nets between terminals of a core module and pads in an array of pads surrounding the core module. The method identifies proximity terminals and cyclic constraints and then routes the signal nets and power nets in separate moat rings that are concentric with the core module. The proximity terminals and any pads involved in cyclic constraints are routed in respective proximity and cyclic moat rings, adjacent the core module and pad array, respectively. Finally, the resulting moat signal nets are promoted within the signal to the next most outwardly adjacent, unoccupied concentric tracks, and then sections of the proximity, signal, power, and cyclic rings are collapsed to the next most radially inward, unoccupied concentric tracks. In a further step, the method of the present invention can route each of the possible orientations of the core module with respect to the array of pads, thereby determining the minimum possible chip area for the desired integrated circuit.

8 Claims, 8 Drawing Sheets

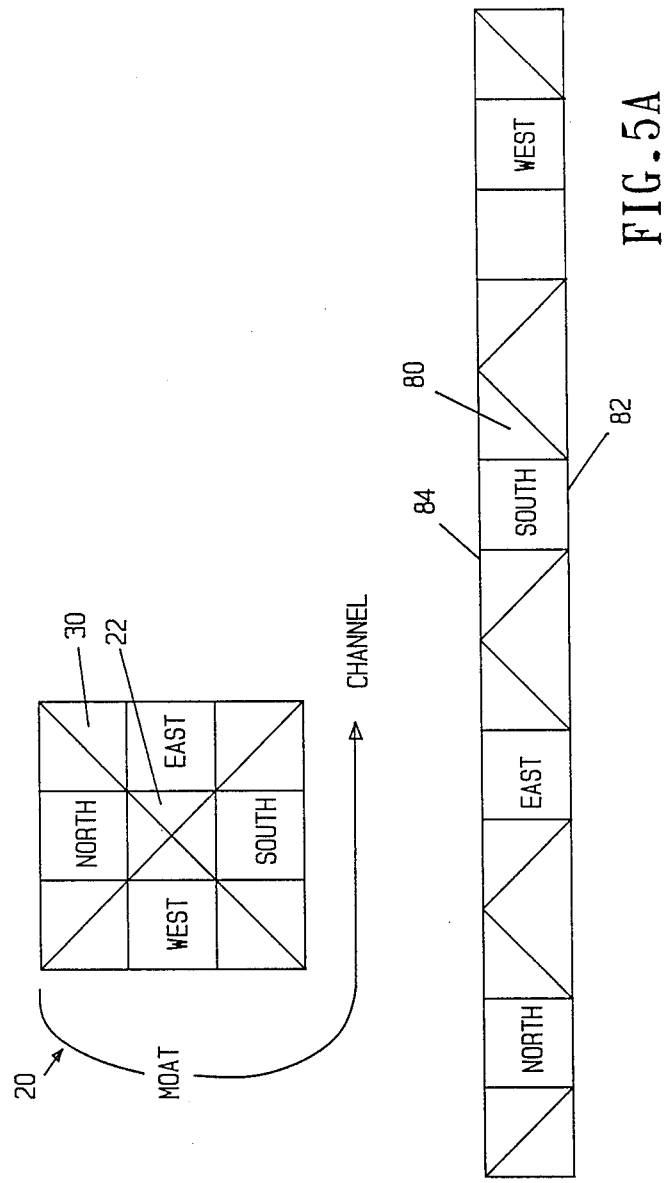

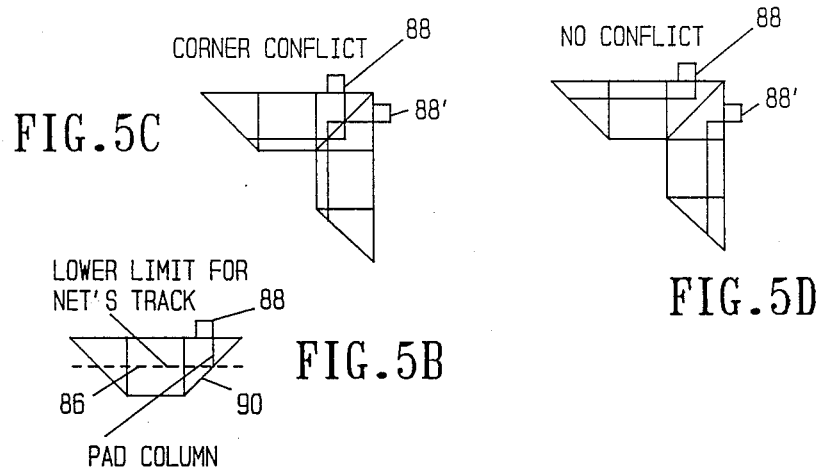
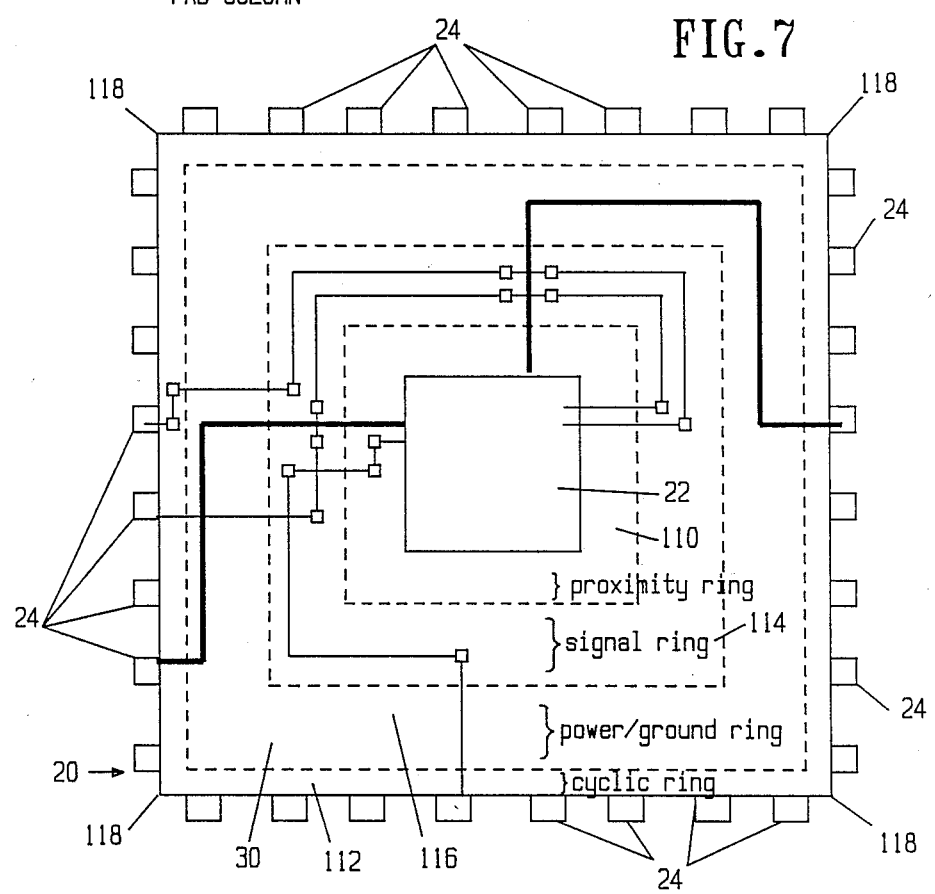

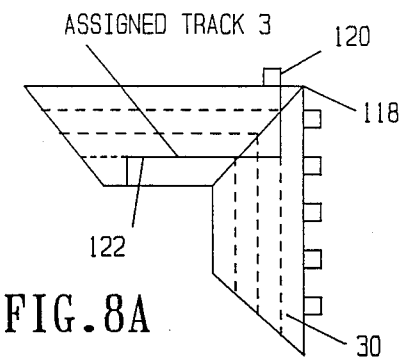
FIG.8A
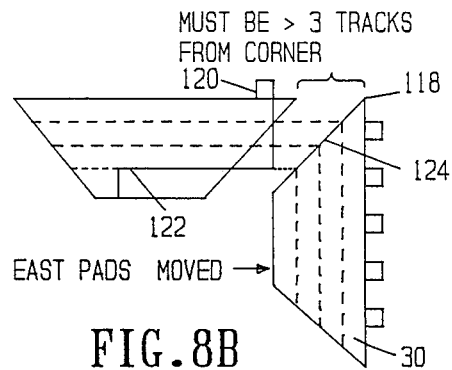
FIG.8B
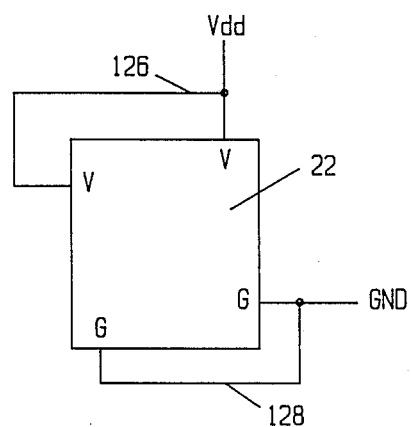
FIG.9A
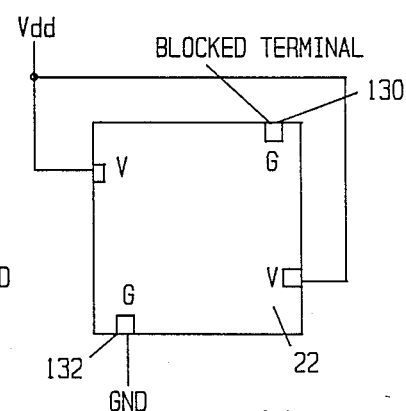
FIG.9B
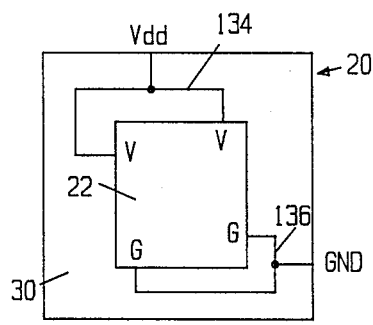
FIG.10
FIG.11
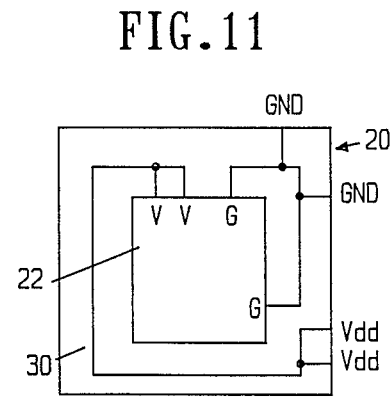

PROXIMITY TERMINAL

MOAT ROUTER FOR INTEGRATED CIRCUITS

TECHNICAL FIELD

The present invention relates to a method of specification of the routing of signal nets between a core module and a surrounding array of pads, and more particularly, to a method of specification of the routing of signal and planar power nets between the terminals on the periphery of a core module containing microelectronic circuitry and the pads in an array of pads surrounding the core module.

BACKGROUND ART

With the advent of large-scale integrated (LSI) and very large-scale integrated (VLSI) circuitry, there has been the need to route the connections between the terminals of the microelectronic circuitry contained within the integrated circuit and the bonding pads on the periphery of the circuit chip. In the manufacture of an integrated circuit, small wires are connected between the bonding pads and the leads on the chip carrier, thereby allowing power and ground to be applied to the integrated circuit and signals to be fed to and received from the integrated circuit. The chip area consumed by the connections between the terminals on the core module containing the microelectronic circuitry and the pads on the array of pads surrounding the core module can strongly influence the overall size of the chip. The chip size, in turn, affects the number of integrated circuits that can be designed within a given amount of substrate area, and it is therefore desirable to make the chip as small as possible.

Routing was originally done by experienced workers. More recently, however, as the number of terminals and pads increases along with the complexity of the microelectronic circuitry, the routing task has been given over to computer-aided design systems. This is particularly the case for an integrated circuit compiler system where the results of the compilation are highly dependent upon the specifics of the circuit being designed.

Several approaches to automated routing have been taken. In one of the most popular, routing has been done using channel routers. The area between the core module terminals and the array of pads can be subdivided into four channels, each channel having two sides. One side of each channel contains the terminals found along one side of the core module of the integrated circuit, while the other side of the channel contains the pads in the array of pads facing that particular side of the core module. Channel routing does not perform acceptably in routing VLSI circuits. This is because a channel router is incapable of efficiently accounting for terminals and pads that lie along the sides of the other channels that define the area between the core module and the array of pads but are connected by signal or power nets to terminals or pads along the sides of the channel being routed.

Other approaches to the routing problem were taken by Lee and Hightower. In the method developed by Lee, for example, beginning and ending points of a path are specified in a rectangular grid, as well as the occupied portions of the area between the beginning and ending points. The shortest path between the beginning and ending points is then determined by an ever-expanding "wavefront" that emanates from the beginning point and continues to propagate until it reaches the specified ending point. Unfortunately, both the Lee and Hightower methods are computationally Lee, for example, beginning and ending points are specified in a rectangular grid, and occupied portions of the area between the beginning and ending points are specified, the shortest path between the beginning and ending point is determined by an ever-expanding "wavefront" that emanates from the beginning point and continues to propagate until it reaches the specified ending point. Unfortunately, both the Lee and Hightower methods are computationally inefficient and consume a great deal of memory.

More recently, channel routers have been used to solve a form of the channel routing problem wherein pads along a top wall of the channel are connected with terminals along the bottom wall by means of signal nets belonging to a predetermined net list. The net list contains a specification of the nets and their connections to pads and terminals on the channel walls. In this approach, two layers are available for routing. It is assumed that the horizontal tracks are formed on one layer, while the vertical columns are formed on the other. The horizontal tracks are isolated from the vertical columns although they can be connected through via holes. Two nets in the net list are said to be constrained if they have corresponding end points on the same vertical column.

A vertical constraint graph can be developed from the net list representation for a particular routing problem. The vertical constraint graph has a node for each net in the net list and a directed edge from a first node to a second node if the corresponding first net must be placed above the corresponding second net in the channel. The vertical constraint graph immediately identifies cyclic constraints, such as nets which are each respectively constrained to be above the other. The vertical constraint graph also identifies cyclic constraints involving three and more nets.

In the "left edge algorithm" method, developed by Hashimoto and Stevens in "Wire Routing by Optimizing Channel Assignment," proceedings of the 8th Design Automation Conference, 1971, pages 214–224, and later improved by Yoshimura in "An Efficient Channel Router," Proceedings of 21st Design Automation Conference, 1984, pages 38–44, a simple and efficient channel router is presented. This channel router guarantees that all nets will be completed if there are no cyclic constraints and the channel height is adjustable. The channel router can be used in the layout design of custom chips as well as uniform structures such as gate arrays. Unfortunately, however, the channel router is unable to properly account for the constraints imposed on nets which must connect terminals or pads in one channel with terminals or pads in another channel.

In another approach, discussed by Rosenberg in "Chip Assembly Techniques for Custom IC Design and a Symbolic Virtual-Grid Environment," 1984 Conference on Advanced Research in VLSI, MIT, the "square doughnut" domain (or moat) formed between the pads and the chip is mapped onto a simple rectangle. This mapping function has to treat the rectangular channel as the sides of a cylinder, with the edges at the ends of the rectangle being connected to each other. The mapping functions must also deal with the corners of the "square doughnut" very carefully. They must map to a single line in the "rectangular channel" domain. Unfortunately, this approach does not guarantee that the nets will be 100 percent routed.

In "A New Area Router, the LRS Algorithm," IEEE International Conference on Circuits and Computers, September–October, 1982, Smith et al. discuss an algorithm that takes advantage of the "radial symmetry" of area routing problems. The first step in this approach is to assign each net to its own "circular" track. Each track is actually square in shape and centered around the middle of the routing region. Succeeding tracks are added outwardly from the center of the routing region. A net can be assigned to a particular track only if each of the pins in that net can be connected to the track by using a single radial segment. Thus, for any given track, there may be several nets that could be assigned to it. While this paper discloses the use of concentric tracks, it does not disclose a routing technique that guarantees 100-percent routing.

Accordingly, it is desirable to have a moat channel router that is based on an efficient channel routing algorithm with additional features addressing the characteristics of the moat area configuration, while minimizing chip area and guaranteeing 100-percent routing completion.

DISCLOSURE OF THE INVENTION

It is an object of the present invention to produce an efficient method for routing the moat between an integrated circuit and a surrounding array of pads.

It is another object of the present invention to produce a moat router that minimizes chip area.

It is still another object of the present invention to provide a moat router that guarantees 100-percent routing completions.

It is a further object of the present invention to provide a moat router that is computationally efficient.

In general, in the present invention, a method of specification of the routing of signal and planar power nets between the terminal on the periphery of the core module containing microelectronic circuitry and pads in an array of pads surrounding the core module comprising several steps is presented. A first step is to identify any signal terminals proximate to one or more power terminals. The method also comprises the steps of establishing a proximity ring in the moat area immediately surrounding the core module, the proximity ring being sized to route any proximity terminals identified in the step above. The method further comprises determining the shortest possible length of each of the signal nets and establishing a channel corresponding to the moat, the channel having parallel sides and having tracks and columns corresponding effectively to the concentric tracks and radial columns of the moat area. The method additionally comprises the steps of determining the vertical constraint graph of the channel signal nets corresponding to the moat signal nets and identifying any cyclic constraints between channel signal nets from the vertical constraint graph. In addition, the method comprises determining the distance to the nearest corner for each moat signal and assigning moat signal nets to concentric tracks and radial columns in a predetermined signal ring in the moat area. Further, the method includes routing the planar power nets in a predetermined power ring in the moat area, routing the proximity terminals in the proximity ring, and routing the cyclically conflicting moat signal nets corresponding to channel signal nets having cyclic conflicts, the cyclically conflicting moat signal nets being routed in a cyclic ring in the moat area adjacent the array of pads and surrounding the core module. Finally, the method comprises promoting segments of the routed moat signal nets and power nets to the next most outwardly adjacent, unoccupied concentric tracks, and then collapsing segments of the proximity, signal, power, and cyclic rings to the next most radially inward, unoccupied concentric tracks.

BRIEF DESCRIPTION OF THE DRAWINGS

FIGS. 5A–D are schematic drawings showing the conditions under which corner conflicts may or may not exist.

FIG. 7 is a schematic drawing showing a possible configuration of the concentric rings used in the method of the present invention.

FIGS. 8A and 8B are schematic drawings showing the removal of corner constraints by pad movement.

FIGS. 9A and 9B are schematic drawings showing the need for the power nets to be planar.

FIG. 10 is a schematic drawing showing non-overlapping power nets having the shortest length.

FIG. 11 is a schematic drawing showing non-overlapping power nets having a longer length than that shown in FIG. 10.

BEST MODE FOR CARRYING OUT THE INVENTION

Figure 1:
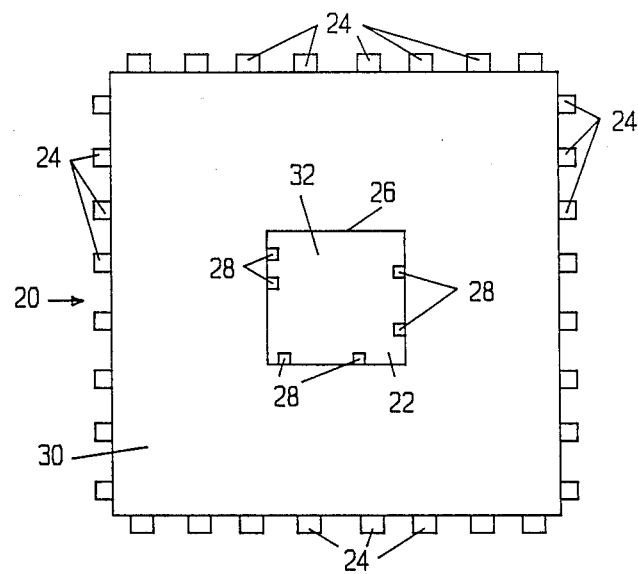
FIG. 1 is a schematic drawing showing the relevant major features of an integrated circuit.

The major features of an integrated circuit are shown in the schematic drawing of FIG. 1. An integrated circuit 20, originally formed from a substrate material that has been subsequently separated from other chips formed on the same substrate, comprises a core module 22 and a plurality of pad 24 surrounding the core module 22 in a predetermined array of pads. The outer periphery 26 of the core module typically has defined thereon a plurality of terminals 28 which are intended to be connected with certain predetermined pads. The area between the outer periphery and the array of pads is referred to as a "moat area" 30. The paths connecting the terminals 28 to the pads must pass through the moat area. Generally, predetermined signals or supply voltages are specified to appear on each of the pads. Thus, the purpose served by each of the pads is predetermined and their cyclic order (for example, clockwise around the array of pads) cannot be altered. Similarly, because of constraints in the design of the microelectronic circuitry 32 contained within the bore module, the signals to be connected to the terminals are predetermined and their order cannot be altered, except for reversal by reflecting the core module about a linear axis.

The patterns of connections between certain predetermined terminals 28 and pads 24 are referred to as "nets." If a set of terminals and/or pads is to carry a signal, the collection of terminals and pads is referred to as a "signal net." Likewise, if a collection of terminals and pads is to be connected to predetermined supply voltages (or ground), the collection of terminals and/or pads is referred to as a "power net."

Figure 2A:
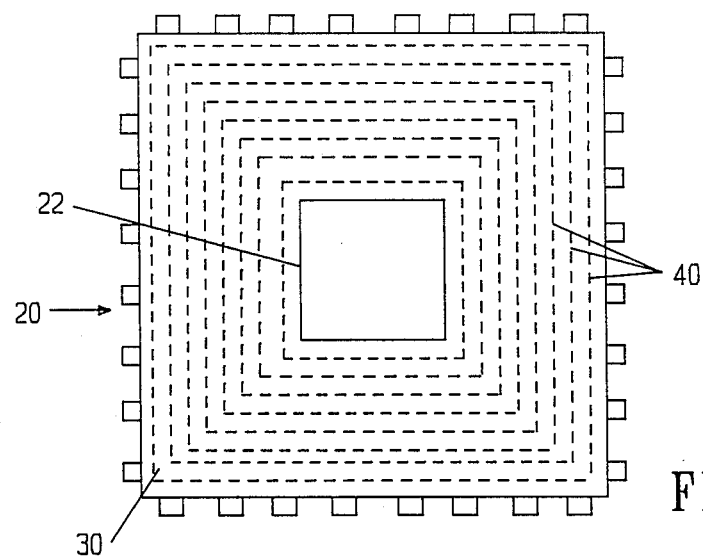
FIGS. 2A and 2B are schematic drawings respectively showing the concentric tracks and radial columns of the grid system used in the method of the present invention.
Figure 2B:
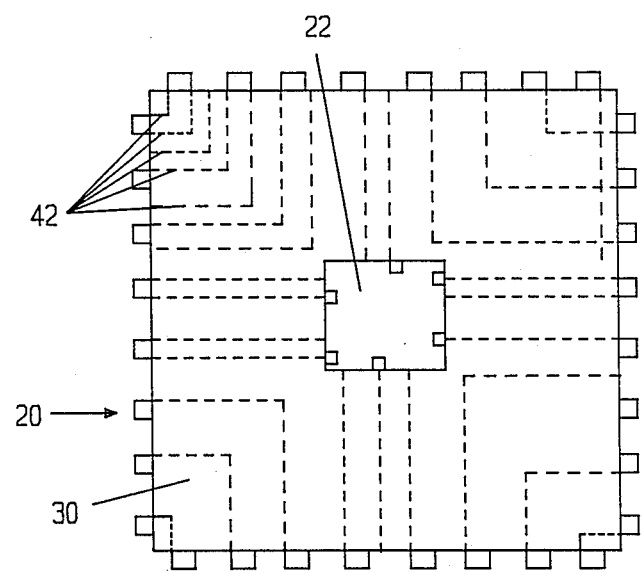

The moat area is typically divided into two orthogonal arrays of virtual paths that can be used by the signal and power nets to accomplish the desired connections between terminals and pads. As shown schematically in FIG. 2A, the moat area of the integrated circuit contains a series of concentric "tracks" 40 which are concentrically placed around the core module. The virtual concentric tracks are designated with respect to each of the layers that comprise the integrated circuit. Similarly, as shown in FIG. 2B, a plurality of radial columns 42 is defined within the moat area. The plurality of radial columns is mutually orthogonal to the plurality of concentric tracks.

The integrated circuit can be made from layers of a number of different materials. Most typically, power nets are realized on metal layers, while signal nets are realized on both a metal layer and a polysilicon layer, with connections ("vias") made between metal and polysilicon paths. In addition, the metal layer used to form the power nets is normally the same metal layer as is used in the signal nets. However, it is possible that the signal nets can be realized using paths on two separate metal layers, in which case the power nets can also be defined on two metal layers.

If the signal nets are defined on one metal layer and one polysilicon layer, the concentric tracks, generally forming the longer portions of the paths in the signal nets, are usually formed on the metal layer, while the radial columns 42 are formed on the polysilicon layer. Depending upon the exact choice of materials used to define the various layers of the signal nets and power nets, a variety of constraints between nets of one or both kinds can come into play in the routing of an integrated circuit.

Figure 3A:
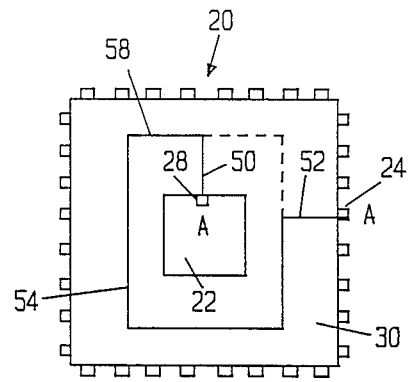
FIGS. 3A and 3B are schematic drawings showing the two possible ways for routing a two-pin net between a terminal and pad.
Figure 3B:
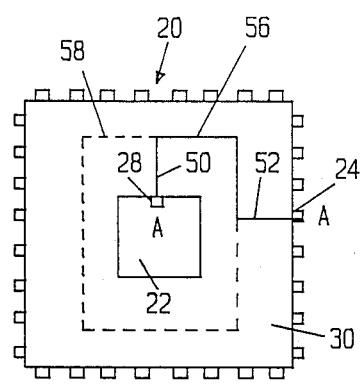

The two possible routings of a two-pin net between a terminal and a pad are shown in the schematic drawings of FIGS. 3A and 3B. In each case, a terminal 28, marked "A," is connected to a pad 24, also designated by "A." Except for leaders 50 and 52, signal nets 54 and 56 are realized on segments of a concentric track 58, a specific instance of one of the concentric tracks 40 shown in FIG. 2A. FIGS. 3A and 3B show that the longer and shorter paths connecting terminal "A" and pad "A" can be longer or shorter, respectively, depending upon whether a shorter or longer portion of the concentric track is eliminated from respective signal nets 54 and 56. In these examples, the leaders are realized on the layer containing the radial columns (see FIG. 2B), for example, the polysilicon layer, while the remainder of the signal nets 54 and 56 are realized from the layer containing the concentric tracks, for example, a metal layer.

Figure 4A:
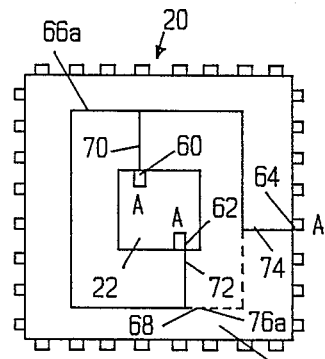
FIGS. 4A–C are schematic drawings showing the three possible ways for routing a three-pin net between two terminals and one pad.
Figure 4B:
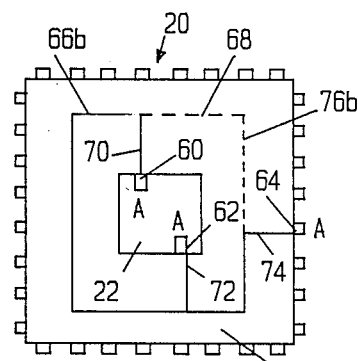
Figure 4C:
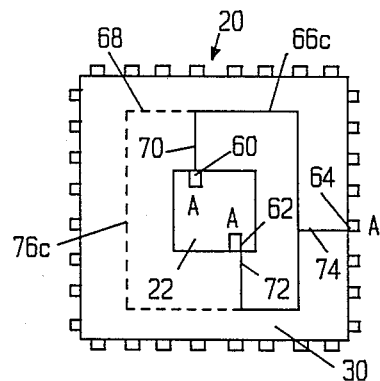

The three possible three-pin signal nets connecting two terminals and one pad are shown in FIGS. 4A-4C. In this situation, terminals 60 and 62 are to be connected to pad 64 through a three-pin net (66a, 66b, and 66c, respectively). For this example, it is assumed that the three-pin net 66 is a power net. The terminals are connected to a concentric track 68 by leaders 70, 72, and 74, respectively. Since the three-pin net shown in FIGS. 4A-4C is assumed to be a power net, the leaders 70, 72, and 74, as well as the remainder of the three-pin nets 66a, 66b, and 66c, respectively, are all formed on the same layer, for example, a metal layer, to minimize power dissipation. The leaders 70, 72, and 74 accordingly divide concentric track 68 into three segments, any one of which can be eliminated from the three-pin net without affecting its connectivity. Accordingly, there are three possible three-pin nets, their lengths being defined by the length of the respective eliminated segments 76a, 76b, and 76c, respectively.

FIG. 5A, a schematic diagram showing how to establish a relationship between the moat area surrounding the core module of an integrated circuit and a channel 80 is shown. The terminals of the core module have corresponding terminals along the lower wall 82 of the channel, while the pads of integrated circuit have corresponding pads located along an upper wall 84 of the channel. The channel can be useful in aiding the concepts relating routing a channel to those of routing a moat area, and the directional terms "north," "south," "east," and "west" also aid in establishing that relationship.

FIGS. 5B-5D are schematic diagrams of the northern edge of the integrated circuit as shown in FIG. 5A. In particular, FIG. 5B illustrates the relationship between the lower limit 86 of the track for the net connected to the pad 88. This lower limit is determined by the diagonal 90 defining the northeast corner of the integrated circuit. FIG. 5C illustrates the corner conflict that can result if two pads 88 and 88' are connected to nets that use tracks below their corresponding lower limits. The result is that the two nets overlap. FIG. 5D shows the elimination of the conflict when the two nets are mapped into tracks that are above the lower limit for the placement of the pads 88 and 88'.

Figure 6:
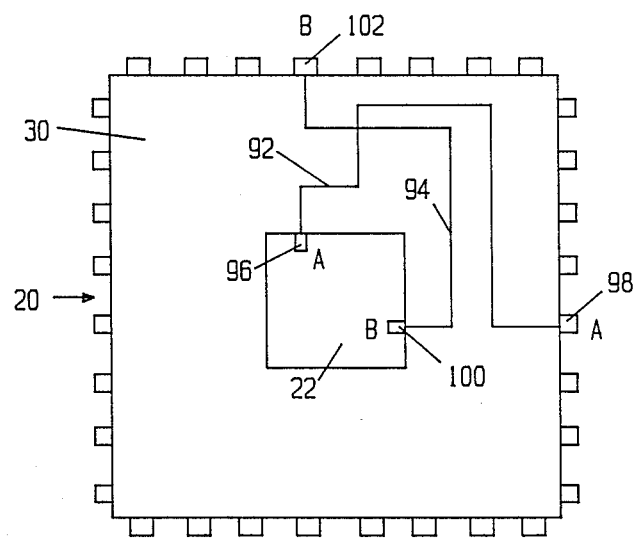
FIG. 6 is a schematic drawing illustrating a cyclic conflicts between two two-pin nets, each connecting a terminal with a pad.

The conditions for the existence of a cyclic conflict are illustrated in the schematic diagram of FIG. 6. In this figure, two two-pin nets, 92 and 94, respectively, are shown. The two-pin net 92 connects terminal 96 and pad 98, while two-pin net 94 connects terminal 100 to pad 102. The cyclic conflict results because terminal 96, belonging to two-pin net 92, appears on the same radial column as does pad 102, on two-pin net 94, while terminal 100 appears on the same radial column as pad 98. Thinking of the placement of two-pin nets 92 and 94 in the channel of FIG. 5A, one skilled in the art will appreciate that near the vicinity of pad 98, two-pin net 94 should appear above two-pin net 92, while near the vicinity of pad 102, two-pin net 94 should appear above two-pin net 92. This cyclic condition is shown in the vertical constraint graph developed, along the lines of Yoshimura, as two nodes corresponding to two-pin nets 92 and 94, being cyclically connected by directed edges.

A schematic diagram showing one possible configuration of the concentric rings used in the method of the present invention is found in FIG. 7. The moat area of the integrated circuit is generally subdivided into four disjoint concentric rings disposed around the core module. A proximity ring 110 can be closest to core module 22. The proximity ring is reserved to contain concentric tracks used to resolve the proximity terminal condition, to be discussed subsequently. A cyclic ring 112 is immediately adjacent the array of pads and reserves enough concentric tracks to resolve the cyclic conflicts, such as the conflict shown in FIG. 6. Clearly, as shown in FIG. 6, these conflicts can be resolved by adding more concentric rings.

Between the proximity ring and the cyclic ring, there exist a signal ring 114 and a power ring 116. While the signal and power rings can appear in any order, generally it is preferable to have the power ring outside of the signal ring since, because of their greater size, pads are necessarily further displaced from the nearest corner 118 of the integrated circuit. This reduces the chances for a corner conflict of the type shown in FIG. 5C.

One skilled in the art will appreciate that, while leaders are necessary to get a signal or power net into its respective ring in the minimum possible distance, all nets of a particular type must appear within the appropriate ring and, accordingly, routing of nets within a particular ring is simplified since all of the nets must be designed to satisfy the same conditions.

FIGS. 8A and 8B are schematic diagrams showing the removal of a corner constraint by moving pads. In the case shown in FIG. 8A, a pad 120 is assigned to a track 122. This causes a corner conflict, as discussed in the text above, concerning FIG. 5C. In order to resolve this conflict, one approach is to translate the portion of the moat area eastward until the net in track 122 no longer crosses the position of diagonal 124. In this particular case, the pad 120 must be more than three tracks away from corner 118.

FIGS. 9A and 9B are schematic diagrams showing the need for all power nets that occupy the same layer (e.g., metal) to be mutually planar. Otherwise the power nets cannot be routed. This means that each power net can be mapped on a plane without crossing the other, regardless of the number of power nets. As shown in FIG. 9A, a Vdd power net 126 and a GND power net 128 are mutually planar. However, the nets shown in FIG. 9B are not mutually planar, since terminal 130 is isolated from terminal 132, to which it should be connected. This kind of conflict cannot be resolved by adding extra concentric tracks or radial columns. Therefore, the method of the present invention works only when all power nets that appear on the same layer are mutually planar.

Mutual planarity can be determined by cycling around the core module and observing to which of the two power nets a particular terminal belongs. If the pattern of power nets changes more than twice when making a single circuit around the core module, the two nets are not mutually planar. Thus, the situation shown in the diagram in FIG. 9A is planar, as shown by the fact that the power net type varies only twice in each circuit around the core module, whereas one circuit around the periphery of the core module in FIG. 9B shows four changes of power net type, automatically indicating that the two nets are not mutually planar.

FIG. 10 is a schematic diagram showing two non-overlapping power nets 134 and 136 which have the shortest possible lengths for the particular power net configuration. FIG. 11 is a schematic diagram of two planar power nets having a slightly longer net length than those shown in FIG. 10.

Figure 12:
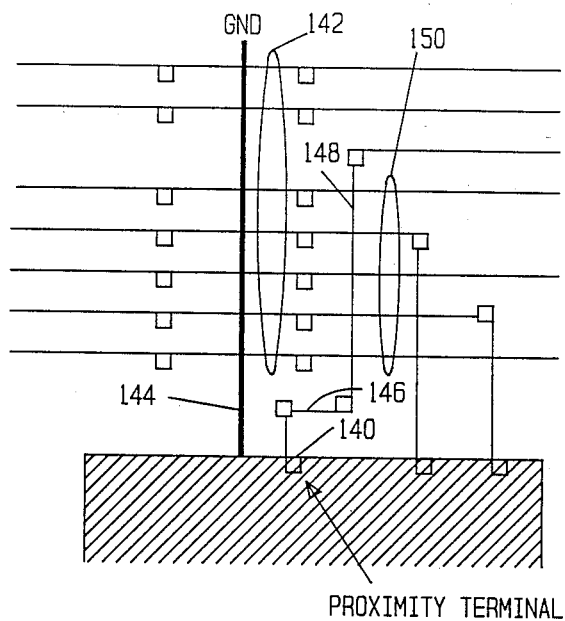
FIG. 12 is a schematic drawing showing an example of a proximity terminal.

FIG. 12 illustrates a "proximity terminal" condition. In such cases, a terminal 140 is too close to a power net that requires that a number of jumpers 142 be formed in order to pass over the power net without shorting out the power net. When the proximity terminal is too close to the power net connection, the vias used to form the jumpers over the power net leader 144 all appear in the same radial column. Accordingly, in order to allow the signal coming from terminal 140 to be passed into the moat area, the signal must first be forced into a different layer (line 146). This allows jumper 148 to pass over lines 150 without causing a short.

Figure 13:
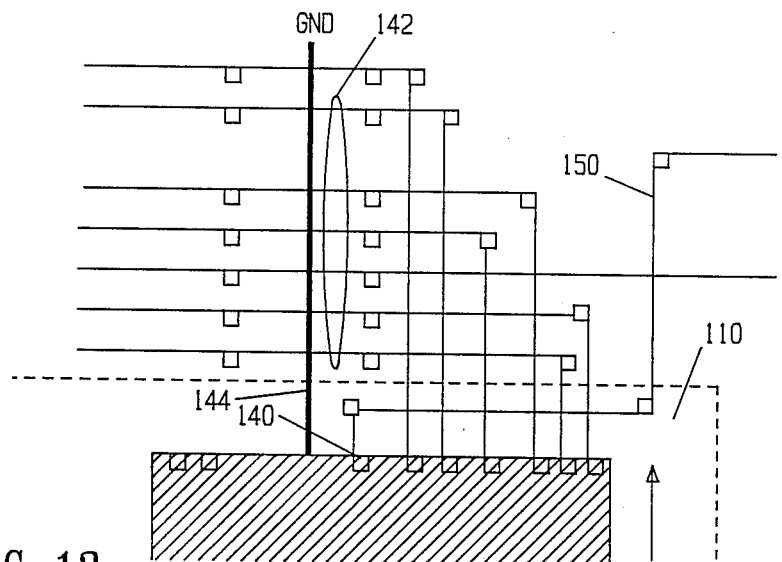
FIG. 13 is a schematic drawing showing the choice of an empty column for a proximity route.

FIG. 13 is a schematic diagram illustrating the choice of empty columns available in proximity ring 110 (in FIG. 7). By expanding enough tracks to proximity ring 110, eventually a radial column 150 will be created, thereby allowing the signal on terminal 140 to be sent to the outside.

Figure 14:
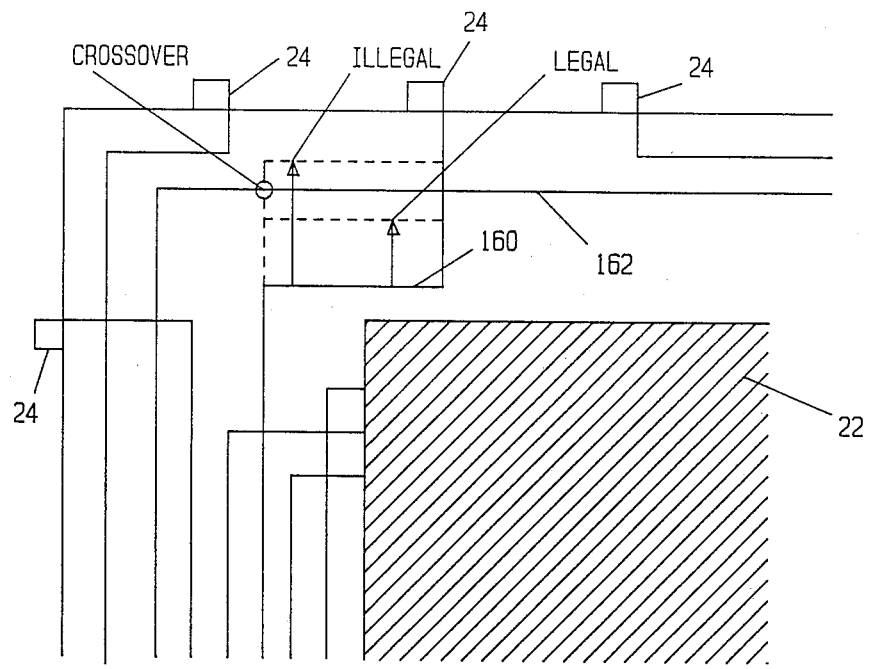
FIG. 14 is a schematic drawing illustrating track promotion.

Track promotion is shown in the schematic diagram of FIG. 14. In this figure, the core module has been fully routed to the appropriate pads 24. Track section 160, containing only signal nets, can be promoted in an outwardly directed radial direction toward occupied track 162. Obviously, track section 160 cannot be pushed above assigned track 162, since an electrical short will result.

Figure 15A:
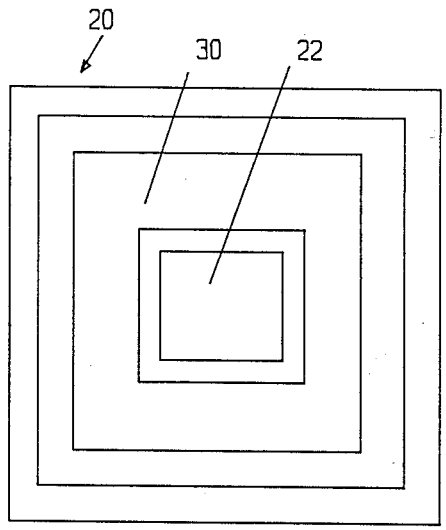
FIGS. 15A and 15B are schematic drawings illustrating ring collapse.
Figure 15B:
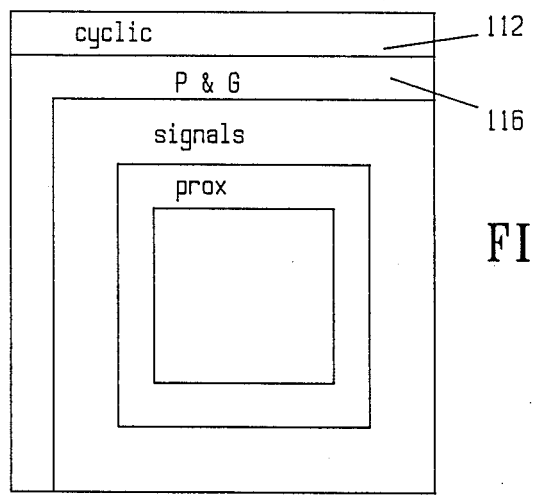

As the final step in compacting the routed moat area, sections of the signal and power nets are moved to the next most radially inward unoccupied tracks. In some cases, such as that shown in FIG. 15B, portions of some of the rings will disappear. This is particularly so in the example shown in FIG. 15B, for a cyclic ring 112 and power ring 116. Neither the signal ring nor the proximity ring has sides that are totally collapsed as a result of ring collapse.

Figure 16:
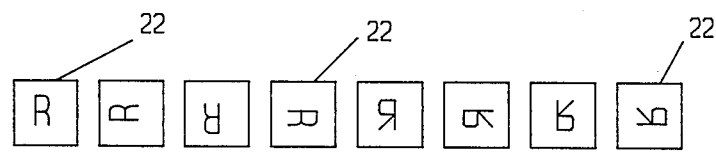
FIG. 16 shows the eight possible core module orientations.

The foregoing discussion has been based upon the assumption that the cyclic order of the pads and the cyclic order of the terminals around the core module are as desired. However, in the interest of minimizing the total chip area, it is often desirable to route each of the eight possible configurations that the core module can have with respect to the array of pads and to choose the routing that produces the minimum total chip area. The eight possible configurations are shown in FIG. 16.

While the foregoing description has described a preferred embodiment of the present invention, those skilled in the art will readily appreciate that modifications to the present invention can be realized without departing from the spirit and scope of the invention. For example, it will be apparent to practitioners in the art that the method of the present invention can be used to route signal nets in any configuration that defines a moat surrounding a core module where the routing is to be accomplished among terminals on the core module and on surrounding circuit elements. Likewise, it will be apparent to those skilled in the art that power nets can be routed alone by treating the power nets as if they were signal nets. Accordingly, the spirit and scope of the present invention are to be measured only by the following claims.

I claim:

1. In an integrated circuit compiler system, a method of specification of the routing of signal nets between a first set of terminals on the periphery of a core module containing microelectronic circuitry and a second set of terminals surrounding the core module, the first set of terminals being in a predetermined order on the periphery of the core module and the second set of terminals being in a predetermined order surrounding the core module, the periphery of the core module and the second set of terminals being separated by a moat area containing concentric tracks and radial columns, the method comprising the steps of:

- determining the shortest possible length of each of the signal nets;
- determining the vertical constraint graph corresponding to the signal nets;
- identifying any cyclic conflicts between channel signal nets from the vertical constraint graph;
- assigning signal nets to concentric tracks and radial columns in a predetermined signal ring in the moat area; and
- routing the cyclically conflicting signal nets having cyclic conflicts, the cyclically conflicting signal nets being routed in a cyclic ring in the moat area adjacent the second set of terminals and surrounding the core module, said cyclic ring being disjoint from the signal ring.

2. The method of claim 1, further comprising the step of placing the core module in each possible distinct position relative to the array of pads.

3. In an integrated circuit compiler system, a method of specification of the routing of signal nets between a first set of terminals on the periphery of a core module containing microelectronic circuitry and a second set of terminals surrounding the core module, the first set of terminals being in a predetermined order on the periphery of the core module and the second set of terminals being in a predetermined order surrounding the core module, the periphery of the core module and the second set of terminals being separated by a moat area containing concentric tracks and radial columns, the method comprising the steps of:

- determining the shortest possible length of each of the signal nets;
- determining the vertical constraint graph corresponding to the signal nets;
- identifying any cyclic conflicts between channel signal nets from the vertical constraint graph;
- assigning signal nets to concentric tracks and radial columns in a predetermined signal ring in the moat area;
- routing the cyclically conflicting signal nets having cyclic conflicts, the cyclically conflicting signal nets being routed in a cyclic ring in the moat area adjacent the second set of terminals and surrounding the core module, said cyclic ring being disjoint from the signal ring;
- promoting segments of the routed signal nets to the next most outwardly adjacent, unoccupied concentric tracks; and
- collapsing sections of the signal, power, and cyclic rings to the next most radially inward, unoccupied concentric tracks.

4. The method of claim 3, further comprising the step of placing the core module in each possible distinct position relative to the array of pads.

5. In an integrated circuit compiler system, a method of specification of the routing of signal and planar power nets between the terminals on the periphery of a core module containing microelectronic circuitry and the pads in an array of pads surrounding the core module, the terminals being in a predetermined order on the periphery of the core module and the pads being in a predetermined order in the array of pads, the periphery of the core module and the array of pads being separated by a moat area containing concentric tracks and radial columns, the method comprising the steps of:

- determining the shortest possible length of each of the signal nets;
- determining the vertical constraint graph corresponding to the signal nets;
- identifying any cyclic conflicts between channel signal nets from the vertical constraint graph;
- assigning signal nets to concentric tracks and radial columns in a predetermined signal ring in the moat area; and
- routing the planar power nets in a predetermined power ring in the moat area, the power ring surrounding the proximity ring and being disjoint from the signal ring.

6. The method of claim 5, further comprising the step of placing the core module in each possible distinct position relative to the array of pads.

7. In an integrated circuit compiler system, a method of specification of the routing of signal and planar power nets between the terminals on the periphery of a core module containing microelectronic circuitry and the pads in an array of pads surrounding the core module, the terminals being in a predetermined order on the periphery of the core module and the pads being in a predetermined order in the array of pads, the periphery of the core module and the array of pads being separated by a moat area containing concentric tracks and radial columns, the method comprising the steps of:

- identifying any signal terminals proximate to one or more power terminals;
- establishing a proximity ring in the moat area immediately surrounding the core module, the proximity ring being sized to route any proximity terminals identified in the step above;
- determining the shortest possible length of each of the signal nets;
- establishing a channel corresponding to the moat, the channel having parallel sides, and having tracks and columns corresponding respectively to the concentric tracks and radial columns of the moat area;
- determining the vertical constraint graph of the channel signal nets corresponding to the signal nets;
- identifying any cyclic conflicts between channel signal nets from the vertical constraint graph;
- determining the distance to the nearest corner for each moat signal net;
- assigning signal nets to concentric tracks and radial columns in a predetermined signal ring in the moat area, the signal ring surrounding the proximity ring in accordance with the constraints on the corresponding channel signal nets as given by the vertical constraint graph;
- routing the planar power nets in a predetermined power ring in the moat area, the power ring surrounding the proximity ring and being disjoint from the signal ring;
- routing the proximity terminals in the proximity ring;
- routing the cyclically conflicting signal nets corresponding to channel signal nets having cyclic conflicts, the cyclically conflicting moat signal nets being routed in a cyclic ring in the moat area adjacent the array of pads and surrounding the core module, said cyclic rings being disjoint from the signal ring and the power ring;
- promoting sections of the routed moat signal nets to the next most outwardly adjacent, unoccupied concentric tracks; and
- collapsing sections of the proximity, signal, power, and cyclic rings to the next most radially inward, unoccupied concentric tracks.

8. The method of claim 7, further comprising the step of placing the core module in each possible distinct position relative to the array of pads.

* * * * *